United States Patent [19]
Houlihan et al.

[11] Patent Number: 4,996,136
[45] Date of Patent: Feb. 26, 1991

[54] RADIATION SENSITIVE MATERIALS AND DEVICES MADE THEREWITH

[75] Inventors: Francis M. Houlihan, North Plainfield; Elsa Reichmanis, Westfield; Larry F. Thompson, Millington, all of N.J.

[73] Assignee: AT&T Bell Laboratories, Murray Hill, N.J.

[21] Appl. No.: 316,051

[22] Filed: Feb. 24, 1989

Related U.S. Application Data

[63] Continuation-in-part of Ser. No. 160,368, Feb. 25, 1988, abandoned.

[51] Int. Cl.$^5$ .............................................. G03C 5/58
[52] U.S. Cl. .................................. 430/313; 430/326; 430/270; 430/945
[58] Field of Search ............... 430/270, 326, 945, 313; 522/27, 49

[56] References Cited

U.S. PATENT DOCUMENTS

| | | | |
|---|---|---|---|
| 4,491,628 | 1/1985 | Ito et al. | 430/176 |
| 4,552,833 | 11/1985 | Ito et al. | 430/325 |
| 4,808,511 | 2/1989 | Holmes | 430/325 |
| 4,810,613 | 3/1989 | Osuch et al. | 430/192 |
| 4,889,191 | 12/1989 | Tsuchiya et al. | 430/270 |
| 4,931,379 | 6/1990 | Brunsvold et al. | 430/326 |
| 4,939,070 | 7/1990 | Brunsvold et al. | 430/326 |

OTHER PUBLICATIONS

Macromolecules; vol. 21, No. 7; Jul. 1988; F. M. Houlihan et al.; pp. 2001–2006; Nitrobenzyl Ester Chemistry.

B. J. Lin, *Journal of Vacuum Science and Technology*, 12, 1317 (1975).
M. J. Bowden, *Materials for Microlithography*, ed. L. F. Thompson, et al., ACS Symposium Series, No. 266, American Chemical Society, Washington, D.C., 1984, p. 49.
Billmeyer, Textbook of Polymer Science, p. 6, 1971, J. Wiley & Sons.
G. Odian, *Principles of Polymerization*, Wiley-Interscience, p. 268 (1981).
*Introduction to Microlithography*, eds. L. F. Thompson, C. G. Willson and M. J. Bowden, ACS Symposium, Series 219, pp. 16–82 (1983).

*Primary Examiner*—Marion C. McCamish
*Assistant Examiner*—Christopher D. RoDee
*Attorney, Agent, or Firm*—B. S. Schneider

[57] ABSTRACT

Sensitive deep ultraviolet resists are formed utilizing a material that undergoes decomposition to form an acid together with a polymer including a chain scission inducing monomer such as sulfonyl units and substituent that undergoes reaction to form an acidic moiety when subjected to the photogenerated species. An exemplary composition includes poly(t-butoxycarbonyloxystyrenesulfone) and 2,6-dinitrobenzyl-p-toluene sulfonate. The sulfonate decomposes to form sulfonic acid upon irradiation. This acid reacts with the polymer group to form an acid functionality while the sulfone moiety of the polymer induces scission. As a result, the irradiated portions of the resist material are soluble in ionic solvents while the unirradiated portions are not.

21 Claims, No Drawings

RADIATION SENSITIVE MATERIALS AND DEVICES MADE THEREWITH

CROSS REFERENCE TO RELATED APPLICATIONS

This application is a continuation-in-part of U.S. copending application Ser. No. 160,368 dated Feb. 25, 1988 now abandoned.

BACKGROUND OF THE INVENTION

1. Technical Field

This invention relates to lithographic processes, and in particular, to lithographic processes involving device fabrication.

2. Art Background

Lithographic processes are typically employed in the manufacture of devices such as semiconductor devices. Among the lithographic processes that are available, photolithography is often utilized. Photolithographic processes have the advantage of being suitable for a blanket exposure technique. That is, a material that is sensitive to the exposing light is coated onto a substrate, e.g., a silicon wafer, that is being processed to form a plurality of devices. The coating material, i.e., the resist, is then subjected to light that has been passed through a mask material so that the light reaching the resist corresponds to a desired pattern that is to be transferred into the underlying substrate. Since the exposure occurs simultaneously over an entire device or a number of devices being processed on a substrate, e.g., a silicon substrate, the procedure is considered a blanket exposure.

A blanket exposure procedure is advantageous because it is relatively fast compared to other methods such as the raster scan technique usually employed when the energy used to expose the resist is a beam of electrons. However, generally, resolution obtainable through a blanket exposure with ultraviolet or visible light is somewhat poorer than that achieved with other methods such as electron lithography.

One resist material, poly(methyl methacrylate) (PMMA) upon exposure with ultraviolet actinic radiation has shown resolution better than that achieved with exemplary resists used at conventional wavelengths (greater than 300 nm). For example, PMMA has been shown to be capable of resolution as good as about 250 nm. (See B. J. Lin, *Journal of Vacuum Science and Technology*, 12, 1317 (1975).) Although PMMA exhibits excellent resolution, its sensitivity to practical sources of actinic radiation is quite limited. Therefore, exposure times are generally excessive for practical applications.

Another suggested photoresist employs a compound that produces an acid moiety upon deep UV irradiation and a polymer that reacts with the generated acid to produce acidic substituents. Typical acid generator/acid sensitive polymer combinations include an onium salt as the photosensitive acid generator and a polymer such as poly(p-t-butoxycarbonyloxystyrene) (BOCS) as the polymer having a reactive substituent.

Other photosensitive systems responsive to ultraviolet light have also been proposed. For example, a system based on indenone polymers has been disclosed in U.S. Pat. No. 4,409,318 dated Oct. 11, 1983. Although this polymer has good resolution, and improved sensitivity over PMMA, further improvement of sensitivity for excimer laser exposure is desirable.

SUMMARY OF THE INVENTION

Enhanced sensitivities to deep UV exposure are achieved in an acid generator/acid sensitive polymer combination by inserting a species in the backbone of the polymer which upon irradiation induces chain scission. For example, a structure such as BOCS is modified by employing a compound with a similar structure but with sulfone moieties in the backbone. Thus, compounds are produced such as poly(p-t-butoxycarbonyloxystyrene-sulfone), i.e., compounds of the formula

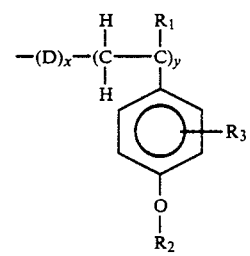

where $R_1$ is H, lower alkyl such as $CH_3$ or lower alkyl derivative, where D is a chain scission inducing moiety such as $(SO_2)$, where $R_3$ is H, Cl, Br, a lower alkyl such as $CH_3$ or a lower alkyl derivative, where $R_2$ is a moiety such that the $O-R_2$ bond breaks in the presence of acid to form a carbonium ion that is sufficiently stabilized to allow subsequent elimination of an available α-hydrogen (e.g., $R_2$ is t-butyl, t-butoxycarbonyl, t-amyloxycarbonyl, 2-methyl-3-trimethylsilyl-2-propanyloxycarbonyl), and where x and y are used to indicate relative proportions of the scission inducing moiety to the carbon moiety and does not imply any ordering in the chain, i.e., the number of carbon atoms between scission inducing moieties need not be the same along the length of the chain. Such materials in combination with a suitable photosensitive acid generator have sensitivities on the order of 50 mJoules/cm$^2$ with a 248 nm excimer laser light source, exhibit resolutions better than 0.5 micrometers, have contrasts up to approximately 4, and are sensitive to deep ultraviolet light, e.g., light in the wavelength range 220 to 300 nm.

Although onium salts are useful in conjunction with these polymers, improved properties are obtained by using acid generating materials of the formula

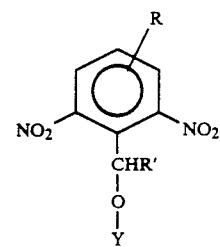

where R is not critical provided R is not acidic and is not so absorbing of ultraviolet light to substantially degrade sensitivity. Exemplary substituents for R are H, lower alkyl and halogen (all R's need not be the same). R' is advantageously H or $CH_3$, while Y is preferably

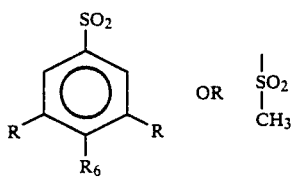

(with R as defined above and $R_6$ is H, lower alkoxy, fluorine, chlorine, $NO_2$, nitrile, acetoxy, or lower alkyl such as $CH_3$). The particular moiety used for Y is not critical provided it requires a temperature of at least 75° C. to cause splitting of the Y moiety from the remainder of the acid generator. These materials are nonionic, and, therefore, a tendency for phase separation between the polymer and the generator is avoided. Additionally, the possibility of contaminating the underlying substrate by an ionic species is also eliminated. It has further been found that these acid generators are useful with a wide variety of resists e.g. poly (p-t- butoxycarbonyloxy-styrene), that depend on an acid generator for inducing a solubility change.

Although the inventive photosensitive acid generating materials are particularly useful in photolithography, they are also sensitive to electrons and x-rays and exposure with these sources is not precluded.

DETAILED DESCRIPTION

As previously discussed, the solubility of the photosensitive composition upon exposure is dependent both on a chain scission process and on the production of acidic moieties in substituents bound to the polymer material. Thus, the exposed material relative to the unexposed material has both a different molecular weight and a different acidity. By utilizing this difference it is possible to employ the resist both as a negative and positive resist. In the latter case, the exposed region is removed by utilizing a solvent for the exposed region. In the former case, the unexposed region is removed by utilizing a suitable solvent. In either case, if the ratio of the rate of dissolution of the photosensitive composition before irradiation compared to that after irradiation is taken as 1:n, n should not be less than 2 and preferably should be more than 10 for a positive image (less than 0.5 for a negative image). Relative solubility ratios with values of n<2 (>0.5 for negative images), typically produce low contrast and inferior image quality. Generally, if a negative image is desired, a solvent is employed that does not induce excessive swelling of exposed regions. Similarly, if a positive image is desired, a solvent is chosen to avoid excessive swelling in the unexposed regions, and also to avoid excessive thickness loss in these areas.

The solution rate of the sensitive material depends both on the number of chain scission inducing moieties, the concentration of the photosensitive acid generator, and the rate of reaction between this molecule and the acid sensitive substituents of the polymer. Typically, to maintain a suitable difference in solubility between exposed and unexposed regions it is desirable that x and y in Equation (1) should have a ratio between 1:1 to 1:10. For ratios below 1:1 synthesis of the polymer becomes difficult while ratios above 1:10 do not yield enhancement due to the chain scission inducing moiety.

Additionally, it is desirable that the relative concentration between the acid generator and the acid sensitive polymer reactive with the generated acid should be in the range 0.5 to 50 weight percent relative to the polymer. A presence of the photosensitive acid generator in a concentration of less than 0.5 weight percent, although not precluded, is undesirable because resolution and sensitivity are degraded. More than 50 weight percent photosensitive acid generator is undesirable because excessive acid generation tends to produce poor image quality. For typical polymers having 1 acid reactive substituent per monomer unit, acid generator concentrations in the range 0.5 to 50 weight percent, preferably 1 to 20 weight percent, are desirable.

As previously discussed, the polymer should have both a chain scission inducing moiety and a substituent that undergoes reaction with a photochemically generated acid to produce an acidic function. Typical of useful polymers undergoing chain scission are styrenesulfone structures. The scission inducing substituents should be chosen such that upon exposure scission occurs at rates sufficient to exceed a $(G_s)$ value of 1. (See, M. J. Bowden, *Materials for Microlithography*, ed. L. F. Thompson, et al., ACS Symposium Series, No. 266, American Chemical Society, Washington, D.C., 1984, p. 49 for a definition of $(G_s)$.) A variety of substituents are available to yield the desired reactivity with acid. Substituents such as t-butyl, t-butoxycarbonyl, t-amyloxycarbonyl, and 2-methyl-3-trimethylsilyl-2-propanyloxycarbonyl are representative of suitable substituents. These substituents are chosen to produce in the presence of acid a carbonium ion that is sufficiently stable to allow the elimination of an available α-hydrogen.

The polymer produced should preferably have a glass transition temperature, $T_g$, that is higher than 30 degrees Centigrade, preferably higher than 50 degrees Centigrade. If the $T_g$ is substantially lower than the given limit, there is a tendency for the resist to flow during subsequent processing, thus degrading image quality. Generally, with monomers such as substituted styrenes, suitable $T_g$'s are obtained. Additionally, the material should form a continuous pinhole-free coating on the substrate to be treated. For example, in the case of a silicon-based substrate, such as a processed silicon device wafer, the subject polymers form excellent coatings. Typically, the thickness of the polymer coating utilized is in the range of 0.2 μm to 2.0 μm, preferably 0.3 μm to 1.0 μm. Thinner coatings are difficult to maintain pinhole free. Additionally, in thicker coatings the resolution is generally inferior since the delineation of narrow features results in the production of narrow columns in the developed pattern that tend to deform. Thicker layers also lead to greater absorption with a resulting degradation in image quality.

An appropriate optical density in the wavelength range to be used for exposure significantly enhances resist quality. Too low an optical density results in inefficient absorption of the exposing radiation and in unnecessarily long exposure times. Too high an optical density does not permit sufficient light to reach the regions of the polymer film furthest removed from its ambient/polymer film interface. This incomplete exposure tends to degrade resist image quality. In general, it is desirable to employ an optical density that is preferably less than 0.5 for at least 30 percent of the actinic radiation that reaches the polymer at the exposure wavelength.

The optical density depends on the concentration of the absorbing species in both the polymer and the acid generator. Thus, once a suitable thickness for the resist material coating is chosen, the resist composition is adjusted to provide the desired optical density. For thicknesses as previously discussed in connection with film continuity, if the desired optical density is maintained, useful results are attained.

The resolution and sensitivity obtained depend on the average molecular weight (defined by Billmeyer, *Textbook of Polymer Science*, p. 6, 1971, J. Wiley & Sons) of the polymer, the distribution of the molecular weight, and the relative proportions of the monomers in the polymer. The relative proportion of chain scission inducing moieties compared to moieties containing the acid reactive function has been discussed previously. For relatively high sensitivities, it is generally desirable to employ polymers with molecular weights greater than 1,000, preferably greater than 2,500 and dispersivities below 10, preferably below 4. (Dispersivity as defined in Billmeyer, supra, p. 6.) Molecular weights greater than $5 \times 10^6$ and dispersivities larger than 10 are not desirable because polymer solubility and resist contrast will be reduced, respectively. The molecular weight of the polymer is determined by the polymerization reaction conditions such as initiator, monomer concentration, and temperature. These parameters are interrelated and a control sample is utilized to determine the specific conditions necessary to yield the desired molecular weight. However, generally, for molecular weights in the desired range, the polymers are produced by a free radical solution polymerization technique employing conditions of temperature below the thermodynamic ceiling temperature, a relative mole fraction of chain scission inducing monomer to acid reactive monomer in the range 1:1 to 1:10, a catalyst that decomposes to form an initiator radical such as a free radical, and a concentration of these monomers in the reaction medium adjusted to yield the desired stoichiometry and molecular weight. (Thermodynamic ceiling temperature is defined by G. Odian in *Principles of Polymerization*, Wiley-Interscience, p. 268 (1981).)

Dispersivity is predominantly dependent on the polymerization technique. To obtain a dispersivity in the desired range, typically, a free radical polymerization is employed. A control sample is used to determine the precise conditions needed for a particularly desired dispersivity.

For use in the inventive procedure, a material that undergoes a conversion into an acidic entity upon irradiation with electromagnetic radiation in the wavelength range 220 to 300 nm is utilized in conjunction with a suitable polymer. For example, onium salts, such as described in U.S. Pat. No. 4,491,628 dated Jan. 1, 1985 which is hereby incorporated by reference, are useful. However, it has been found that nonionic molecules have less tendency to separate from the polymer in the resist composition and are less likely to produce undesirable properties in the substrate to be processed. An advantageous class of materials that undergoes conversion to an acid upon irradiation is represented by the formula

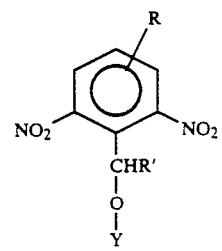

where R is not critical provided it is neither acidic nor absorbs sufficient UV exposing light to substantially decrease sensitivity. Exemplary substituents for R are H, lower alkyl and halogen (all R's need not be the same). R' is advantageously H or CH$_3$, while Y is preferably

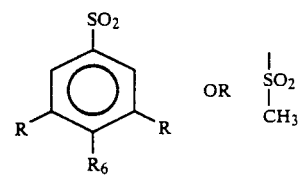

(with R as defined above and R$_6$ is H, lower alkoxy, fluorine, chlorine, NO$_2$, nitrile, acetoxy or lower alkyl such as CH$_3$). The particular moiety used for Y is not critical provided it requires a temperature of at 75° C. to cause splitting of the Y moiety from the remainder of the acid generator. This material, upon irradiation, produces a sulfonic acid and a nitroso-benzaldehyde or a related structure. The resulting sulfonic acid then reacts with substituents on the polymer to produce a polymer having acidic functionalities. For such molecules, it is possible to further substitute on the aromatic rings. However, substituents that are acidic should be avoided because the polymer will degrade prior to usage. A particularly effective material is 2,6-dinitrobenzyl-p-toluene sulfonate.

The use of the resist material, including a suitable polymer and a photosensitive acid generator, involves the coating of the wafer to be processed. These resist materials are typically coated onto a substrate, e.g., a semiconductor based wafer such as a silicon wafer that is being processed to form semiconductor devices and exposed to deep ultraviolet radiation (or electrons or x-rays) to delineate a pattern for a subsequent process such as an etching or metallization process. It should be emphasized that during the processing of semiconductor wafers it is possible to form the photosensitive body by depositing the resist on a substrate surface that includes a semiconductor material, an insulator, such as a silicon oxide, a metal, or a combination of these materials. Exemplary of other suitable substrates are chromium mask blanks and x-ray mask blanks. The coating process is conventional. Typically, the polymer is dissolved in a suitable solvent such as cyclopentanone, the solution is filtered and then placed on the wafer to be coated, and the wafer is spun. The spinning procedure distributes the solution essentially uniformly on the surface of the wafer, and also causes the evaporation of substantially all of the solvent. In this manner, films in the thickness range 0.2 μm to 2.0 μm (representative of thicknesses employed in lithography) are produced on an appropriate substrate material such as a silicon or GaAs wafer being processed into semiconductor devices.

After coating, the material is preferably prebaked to remove any remaining solvent. Pre-exposure baking temperatures in the range 70 to 105 degrees Centigrade for times in the range 15 to 60 minutes are desirable. The resist material is then exposed to energy such as deep UV light, x-rays, or electrons. Typical doses in the range 50 to 250 mJoules/cm$^2$ for deep UV light are employed. (Corresponding doses for electron and x-ray irradiation are useful). Conventional exposure techniques such as described in *Introduction to Microlithography*, eds. L. F. Thompson, C. G. Willson and M. J. Bowden, ACS Symposium, Series 219, pp. 16–82 (1983), Washington, D.C. are employed to delineate the photosensitive material. It is then desirable to post-bake the exposed material. This post-bake enhances the cleavage reaction of chain substituents with the generated acid. Generally, post-bake temperatures in the range 70 to 115 degrees Centigrade for time periods from 20 seconds to 30 minutes are effective. Although heating means such as a convection oven are useful, better image quality is obtained using a hot plate baking apparatus such as sold by Brewer Sciences. Solvents suitable for developing the exposed image are materials such as water/tetramethylammonium hydroxide water/NaOH or lower alkyl alcohol mixtures of lower alkyl alcohols such as isopropanol ethanol and methanol with or without water for a positive image and hexane/methylene chloride for a negative image. Generally, immersion in the developer for time periods from 20 seconds to 2 minutes produces the desired delineation.

The following Examples are illustrative of the conditions employed to produce the inventive photosensitive bodies and to delineate patterns in them.

EXAMPLE 1

Synthesis of Acid Generator

A solution of 1.1 grams of sodium borohydride dissolved in 16 ml of 0.2N sodium hydroxide (temperature 10-23 degrees Centigrade) was dropwise added to a solution of 10 grams of 2,6-dinitrobenzaldehyde in 75 ml of methanol. The reaction mixture was stirred at room temperature for 30 minutes. The methanol was then removed under vacuum and the water residue extracted several times with ether. The ether washings were dried over anhydrous magnesium sulfate and filtered. After solvents were removed on a rotary evaporator under reduced pressure, the residue was recrystallized 3 times from a chloroform/carbon tetrachloride composition yielding 9.17 grams of 2,6-dinitrobenzyl alcohol.

A solution was prepared containing 2 grams of the 2,6-dinitrobenzyl alcohol and 2.37 grams of tosyl chloride in 15 ml of dry acetone (20 degrees Centigrade). A solution of dicyclohexyl amine (2.25 ml in 5 ml of dry acetone) was added dropwise to the 2,6-dinitrobenzyl alcohol mixture. The reaction mixture was stirred overnight at room temperature. The reaction mixture was then treated as described above for the preparation of 2,6-dinitrobenzyl alcohol. After recrystallization, 2.3 grams of 2,6-dinitrobenzyl tosylate was obtained.

Additionally, the same procedure that was used to produce 2,6-dinitrobenzyl tosylate was also followed to produce 2,6-dinitrobenzyl 4-nitrobenzene sulfonate. This was accomplished by substituting 2.75 grams of 4-nitrobenzene sulfonyl chloride for the tosyl chloride employed in the above-described synthesis. Approximately 1.82 grams of the product after recrystallization was obtained. Similarly, 2,6-dinitrobenzyl 4-methoxybenzene sulfonate was prepared by the same procedure utilizing 2.3 grams of 4-methoxybenzene sulfonyl chloride. The result was approximately 1.9 grams of the product.

Preparation of a t-Butoxycarbonyloxy Styrene-Sulfone Polymer

Approximately 10 grams of distilled t-butoxycarbonyloxy styrene and 0.056 grams of azo-bis-isobutyronitrile were mixed in a high pressure, glass reaction vessel. The resulting solution was degassed on a vacuum line. This solution was cooled with dry ice-/acetone and sulfur dioxide was slowly condensed into the reaction flask until a total volume of 14 ml was obtained. The flask was sealed under vacuum. The flask was then removed from the dry ice/acetone and kept in the ambient until it reached room temperature. The flask and the reaction mixture was then heated to approximately 60 degrees Centigrade by immersing it in a constant temperature bath. The reaction mixture was maintained at this temperature for 6 hours with stirring provided by a magnetic stirrer. Approximately 45 ml of acetone was added to the reaction mixture. The resulting solution was precipitated in methanol. The precipitate was then collected by filtration, washed with methanol, and then dried under vacuum for 24 hours. In this way, 5 grams of polymer was recovered.

The Preparation of Poly(p-t-Butoxycarbonyloxy Styrene)

The same procedure as the preparation described in U.S. Pat. No. 4,491,628 dated Jan. 1, 1985 (which is hereby incorporated by reference) for this polymer was followed. This synthesis is found in column 4, lines 53 through 63 of the patent.

The Preparation of Poly(p-t-Butoxycarbonyloxy α-Methylstyrene)

The same preparation procedure as that described in U.S. Pat. No. 4,491,628 for this polymer was followed. This synthesis is found in column 3, lines 19 through 42 and column 4, lines 64 through 68, and column 5, lines 1 through 13 of the patent.

EXAMPLE 2

Approximately 1 gram of poly(t-butoxycarbonyloxy α-methylstyrene) and 0.2 gram of 2,6-dinitrobenzyl tosylate (obtained from the synthesis described in Example 1) was dissolved in 10 ml of cyclohexanone. The solution was filtered through a stack of 0.5 micrometer and 0.2 micrometer Teflon filters.

Silicon wafers measuring approximately 4 inches in diameter were coated. This coating was done by first treating the silicon substrate with hexamethyldisilazane and then placing approximately 2 ml of the polymer solution onto the substrate. The substrates were spun at a speed of approximately 3000 rpm. After spinning for 60 seconds, the substrates were placed in a forced air convection oven at 90 degrees Centigrade for 20 minutes.

The resists on the substrates were exposed utilizing a Karl Suss Model MA56A deep UV contact printer. (The primary exposing wavelength was 200–280 nanometers.) Exposure times were approximately 30 seconds yielding a dose of approximately 100 mJoules/cm$^2$. The exposure was done through a chrome on quartz mask having a standard resolution pattern containing a series of lines and spaces of decreasing separation.

The wafer was baked after exposure in a forced air convection oven for 5 minutes at 90 degrees Centigrade. The wafers were then developed by immersion for 60 seconds in a 1:4 aqueous solution of 25 percent tetramethylammonium hydroxide. The wafer was then rinsed in distilled water for 30 seconds. The resolution was at least as good as a half micron (the smallest feature size on the mask).

EXAMPLE 3

The procedure of Example 2 was followed except the polymer utilized was poly(t-butoxycarbonyloxy styrene-sulfone). Additionally, the initiator was bought from Alpha Ventron and denominated by them as triphenylsulfonium hexafluoroarsenate at a concentration of 5 percent relative to the weight of the polymer (analysis indicates this material is a complex mixture of onium salts). The developer was a 1:15 aqueous solution of 25 percent tetramethylammonium hydroxide. An exposure dose of approximately 50 mJoules/cm$^2$ was utilized yielding a resolution of at least 0.8 $\mu$m (the smallest feature size on the exposure mask).

EXAMPLE 4

The procedure of Example 3 was followed except the polymer utilized was poly(t-butoxycarbonyloxy styrene) and the developer was that of Example 2. An exposure dose of 150 mJoules/cm$^2$ was utilized yielding a resolution of at least 0.8 $\mu$m.

EXAMPLE 5

The procedure of Example 2 was followed except 0.14 grams of 2,6-dinitrobenzyl 4-nitrobenzene sulfonate was employed rather than the tosylate. Additionally, baking was performed for two minutes at 120° C. on a hot plate. The exposure was for approximately 1.5 seconds yielding a dose of approximately 19 mJoules/cm$^2$ and the post exposure bake was performed on a hot plate for 30 seconds at 120° C. The wafers were developed in isopropyl alcohol for 90 seconds. The resolution was approximately the same as that obtained in Example 2.

EXAMPLE 6

The procedure of Example 5 was followed except 0.13 grams of 2,6-dinitrobenzyl 4-methoxybenzene sulfonate was utilized as the acid generator. The exposure was for approximately 5 seconds yielding a dose of approximately 65 mJoules/cm$^2$. Again approximately the same resolution as described in Example 2 was obtained.

We claim:

1. A process for fabricating a device comprising the steps of forming a radiation sensitive region on a substrate, exposing said region to said radiation to form a pattern, developing said pattern, and employing said pattern to define areas of said device, characterized in that said radiation sensitive region comprises a material including (1) a polymer composition represented by the formula:

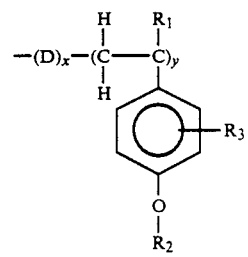

where $R_1$ is chosen from the group consisting of H, lower alkyl ad lower alkyl derivatives, where D comprises a backbone scission inducing moiety located in said backbone, where $R_3$ is chosen from the group consisting of H, Cl, Br, lower alkyl, and lower alkyl derivatives, where $R_2$ is chosen such that the O—$R_2$ bond cleaves in the presence of acid to form a carbonium ion that is sufficiently stable to eliminate an available $\alpha$-hydrogen, and where x and y indicate the relative proportions of said scission moiety to chain moiety without implying ordering of moieties in the chain, and (2) a composition that results in generation of an acidic moiety as a result of irradiation with said radiation.

2. The process of claim 1 wherein said acid generator comprises a material represented by the formula

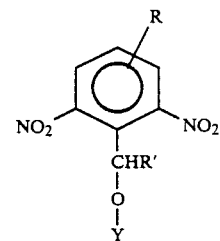

where R is not acidic, R' comprises a member of the group consisting of H and CH$_3$ and Y comprises a member of the group consisting of

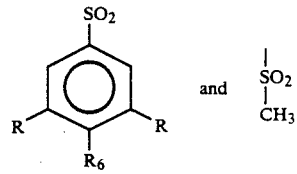

where $R_6$ comprises a member chosen from the group consisting of H and CH$_3$.

3. The process of claim 2 wherein said radiation comprises deep ultraviolet radiation.

4. The process of claim 3 wherein the sources of said radiation comprises an excimer laser.

5. The process of claim 2 wherein the ratio of x to y is in the range 1:1 to 1:10.

6. The process of claim 5 wherein the relative concentration between said acid generator and said polymer composition is in the range 0.5 to 50 weight percent.

7. The process of claim 2 wherein said radiation sensitive region is formed by spinning.

8. The process of claim 2 wherein said step of employing said pattern comprises etching or metallization.

9. The process of claim 1 wherein said radiation comprises deep ultraviolet radiation.

10. The process of claim 9 wherein the source of said radiation comprises an excimer laser.

11. The process of claim 9 wherein the ratio of x to y is in the range 1:1 to 1:10.

12. The process of claim 11 wherein the relative concentration between said acid generator and said polymer composition is in the range 0.5 to 50 weight percent.

13. The process of claim 1 wherein said radiation sensitive material is formed by spinning.

14. The process of claim 1 wherein said step of employing said pattern comprises etching or metallization.

15. The process of claim 1 wherein $R_2$ is chosen from the group consisting of t-butyl, t-butoxycarbonyl, t-amyloxycarbonyl, and 2-methyl-3-trimethylsilyl-2-propanyloxycarbonyl.

16. The process of claim 1 wherein said acid generator comprises a material represented by the formula

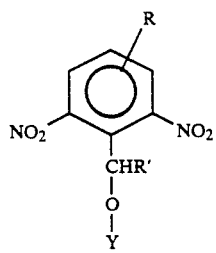

where R is not acidic R' comprises a member of the group consisting of H and $CH_3$ and Y is chosen so that it requires a temperature of at least 75° C. to cause its removal from the remainder of said acid generator.

17. The process of claim 16 wherein Y is chosen from the group consisting of

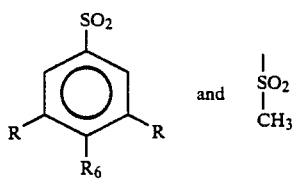

where $R_6$ comprises a member of the group consisting of lower alkoxy, fluorine, chlorine, $NO_2$, nitrile, acetoxy and lower alkyl.

18. A process for fabricating a device comprising the steps of forming a radiation sensitive region on a substrate, exposing said region to said radiation to form a pattern, developing said pattern, and employing said pattern to define areas of said device, characterized in that said radiation sensitive region comprises a material including (1) a material that undergoes a reaction in response to an acidic moiety and (2) an acid generating material represented by the formula

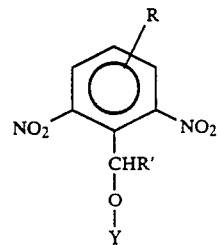

where R is not acidic, R' comprises a member of the group consisting of H and $CH_3$ and Y comprises a member of the group consisting of

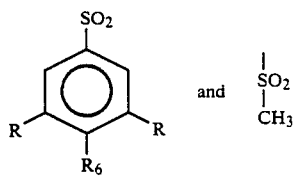

where $R_6$ comprises a member chosen from the group consisting of H and $CH_3$.

19. The process of claim 18 wherein said step employing said pattern comprises etching or metallization.

20. A process for fabricating a device comprising the steps of forming a radiation sensitive region on a substrate, exposing said region to said radiation to form a pattern, developing said pattern, and employing said pattern to define areas of said device, characterized in that said radiation sensitive region comprises a material including (1) a material that undergoes a reaction in response to an acidic moiety and (2) an acid generating material represented by the formula

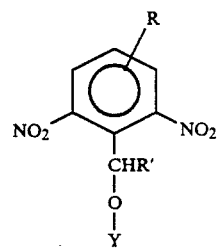

where R is not acidic, R' comprises a member of the group existing of H and $CH_3$ and Y is chosen such that it requires a temperature of at least 75° C. to cause its removal from the remainder of said acid generator.

21. The process of claim 20 wherein Y is chosen from the group consisting of

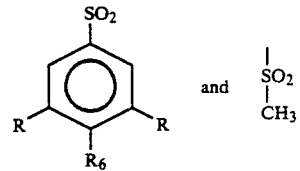

where $R_6$ comprises a member of the group consisting of lower alkoxy, fluorine, chlorine, $NO_2$, nitrile, acetoxy, and lower alkyl.

* * * * *